United States Patent
Zhan et al.

(10) Patent No.: US 11,380,594 B2
(45) Date of Patent: Jul. 5, 2022

(54) AUTOMATIC OPTIMIZATION OF MEASUREMENT ACCURACY THROUGH ADVANCED MACHINE LEARNING TECHNIQUES

(71) Applicant: KLA-TENCOR CORPORATION, Milpitas, CA (US)

(72) Inventors: Tianrong Zhan, Shanghai (CN); Yin Xu, Shanghai (CN); Liequan Lee, Fremont, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 514 days.

(21) Appl. No.: 15/903,693

(22) Filed: Feb. 23, 2018

(65) Prior Publication Data
US 2019/0148246 A1     May 16, 2019

Related U.S. Application Data

(60) Provisional application No. 62/586,660, filed on Nov. 15, 2017.

(51) Int. Cl.
*H01L 21/66* (2006.01)
*G06N 3/04* (2006.01)
(Continued)

(52) U.S. Cl.
CPC ......... *H01L 22/12* (2013.01); *G01N 21/8806* (2013.01); *G01N 21/9501* (2013.01);
(Continued)

(58) Field of Classification Search
CPC ..... H01L 22/12; H01L 22/20; G01N 21/8806; G01N 21/9501; G06N 3/0454; G06N 3/08
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |

(Continued)

FOREIGN PATENT DOCUMENTS

TW     201734955 A     10/2017

OTHER PUBLICATIONS

Hao. Yu, B.M. Wilamowski, "Levenberg-marquardt training" Industrial Electronics Handbook, Intelligent Systems, vol. 5, CRC Press (2011), pp. 12-1-12-15 (Year: 2011).*

(Continued)

*Primary Examiner* — Eric Nilsson
(74) *Attorney, Agent, or Firm* — Hodgson Russ LLP

(57) ABSTRACT

Machine learning techniques are used to predict values of fixed parameters when given reference values of critical parameters. For example, a neural network can be trained based on one or more critical parameters and a low-dimensional real-valued vector associated with a spectrum, such as a spectroscopic ellipsometry spectrum or a specular reflectance spectrum. Another neural network can map the low-dimensional real-valued vector. When using two neural networks, one neural network can be trained to map the spectra to the low-dimensional real-valued vector. Another neural network can be trained to predict the fixed parameter based on the critical parameters and the low-dimensional real-valued vector from the other neural network.

20 Claims, 5 Drawing Sheets

(51) Int. Cl.
  *G01N 21/88* (2006.01)
  *G01N 21/95* (2006.01)
  *G06N 3/08* (2006.01)

(52) U.S. Cl.
  CPC ............ *G06N 3/0454* (2013.01); *G06N 3/08* (2013.01); *H01L 22/20* (2013.01)

(56) References Cited

U.S. PATENT DOCUMENTS

| | | | |
|---|---|---|---|
| 6,429,943 | B1 | 8/2002 | Opsal et al. |
| 7,478,019 | B2 | 1/2009 | Zangooie et al. |
| 7,873,585 | B2* | 1/2011 | Izikson ............... G03F 7/70625 706/21 |
| 7,933,026 | B2 | 4/2011 | Opsal et al. |
| 9,347,872 | B1* | 5/2016 | Poslavsky .......... G01N 21/9501 |
| 9,915,522 | B1 | 3/2018 | Jiang et al. |
| 2009/0122321 | A1 | 5/2009 | Rosenthal et al. |
| 2010/0094790 | A1 | 4/2010 | Gnojewski |
| 2012/0022836 | A1 | 1/2012 | Ferns et al. |
| 2013/0158957 | A1* | 6/2013 | Lee ......................... G06F 30/20 703/1 |
| 2014/0032463 | A1 | 1/2014 | Jin et al. |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2015/0058813 | A1 | 2/2015 | Kim et al. |
| 2015/0204664 | A1 | 7/2015 | Bringoltz et al. |
| 2016/0117847 | A1 | 4/2016 | Pandev et al. |
| 2016/0216197 | A1 | 7/2016 | Bringoltz et al. |
| 2016/0282105 | A1* | 9/2016 | Pandev ............... G01B 11/0616 |
| 2017/0140240 | A1* | 5/2017 | Socher ................. G06N 3/0454 |
| 2018/0032864 | A1* | 2/2018 | Graepel ............... G06N 3/0454 |
| 2019/0095797 | A1* | 3/2019 | Dhandapani ............ H01L 22/20 |

OTHER PUBLICATIONS

Abel, Johannes, Maximilian Strake, and Tim Fingscheidt. "Artificial bandwidth extension using deep neural networks for spectral envelope estimation." 2016 IEEE International Workshop on Acoustic Signal Enhancement (IWAENC). IEEE, 2016. (Year: 2016).*

ISA/KR, International Search Report and Written Opinion for PCT/US2018/061155 dated Mar. 8, 2019.

TWIPO, First Office Action for TW Application No. 107139790, dated Apr. 25, 2022 (see X/Y/A designations at pp. 11-12).

* cited by examiner

AUTOMATIC OPTIMIZATION OF MEASUREMENT ACCURACY THROUGH ADVANCED MACHINE LEARNING TECHNIQUES

CROSS-REFERENCE TO RELATED APPLICATIONS

This application claims priority to the provisional patent application filed Nov. 15, 2017 and assigned U.S. App. No. 62/586,660, the disclosure of which is hereby incorporated by reference.

FIELD OF THE DISCLOSURE

This disclosure relates to semiconductor metrology.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Minimizing the total time from detecting a yield problem to fixing it determines the return-on-investment for the semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Metrology may be used during semiconductor manufacturing to take various measurements of, for example, a semiconductor wafer or reticle. Metrology tools can be used to measure structural and material characteristics associated with various semiconductor fabrication processes. For example, the metrology tools can measure material composition or can measure dimensional characteristics of structures and films such as film thickness, critical dimension (CD) of structures, or overlay. These measurements are used to facilitate process controls and/or yield efficiencies during the manufacture of semiconductor dies.

As semiconductor device pattern dimensions continue to shrink, smaller metrology targets are often required. Furthermore, the requirements for measurement accuracy and matching to actual device characteristics increase the need for device-like targets as well as in-die and even on-device measurements. Various metrology implementations have been proposed to achieve that goal. For example, focused beam ellipsometry based on primarily reflective optics has been proposed. Apodizers can be used to mitigate the effects of optical diffraction causing the spread of the illumination spot beyond the size defined by geometric optics. The use of high-numerical-aperture tools with simultaneous multiple angle-of-incidence illumination is another way to achieve small-target capability.

Other measurement examples may include measuring the composition of one or more layers of the semiconductor stack, measuring certain defects on (or within) the wafer, and measuring the amount of photolithographic radiation exposed to the wafer. In some cases, a metrology tool and algorithm may be configured for measuring non-periodic targets.

Metrology techniques can characterize parameters of a semiconductor wafer during a manufacturing process. In practice, light is directed onto a periodic grating formed in a semiconductor wafer and spectra of reflected light is measured and analyzed to characterize the grating parameters. Characterization parameters may include CD, sidewall angle (SWA), feature height (HT), etc., which affect the polarization and intensity of the light reflected from or transmitted through a material. Analysis of measured spectra generally involves comparing the measured sample spectra to simulated spectra to deduce a model's parameter values that best describe the measured sample.

Measurement of parameters of interest usually involves multiple algorithms. For example, optical interaction of the incident beam with the sample is modeled using an electromagnetic (EM) solver and uses such algorithms as rigorous coupled wave analysis (RCWA), finite element modeling (FEM), method of moments, surface integral method, volume integral method, finite-difference time domain (FDTD), and others. The target of interest is usually modeled (parametrized) using a geometric engine a process modeling engine, or a combination of both. A geometric engine is implemented, for example, in the AcuShape software product from KLA-Tencor.

These modeling methods can include modification of fixed or floated parameters; modification of parameter constraint; modification of nominal value of fixed parameters; modification of coordinates of parameter space; selection or weighting of a subsystem or channel; wavelength selection or weighting; multi-pass; data feedforward; multi-model; or modification of a regression engine.

Using optical metrology to measure critical parameters (CPs) on a patterned wafer often involves developing a parametric geometric model that approximates the measured structure of the wafer and solves electromagnetic problems for a series of geometric models to obtain a matching spectra response between the measured spectra and a calculated one using a model with a set of specific values. To achieve optimal measurement accuracy for critical parameters, refinement of the models is required to optimize the measurement accuracy, which is quantified in terms of goodness of matching of measured results of critical parameters to their true values. The true values are typically provided as reference data for the critical parameters from other metrology techniques (such as CD-SEM and TEM). In the models involved, besides critical parameters with their values varying with specific measurements on the wafer, there are fixed parameters (FPs) kept inherently constant at their nominals, as well as the constraints among different modeling parameters. Refining those components improves of measurement accuracy for critical parameters.

Grid-based search methods have been used with metrology parameters. Such grid-based search methods exhaustively search over a set of configurations of fixed parameters to adjust sampled within their given value range. Optimal values of the fixed parameters are estimated because those produce the best measurement accuracy for critical parameters with respect to given reference data.

Gradient-based search methods have been used with metrology parameters. Such gradient-based search methods (e.g., Levenberg-Marquardt algorithm) start from certain starting values of fixed parameters to adjust and employ a gradient of critical parameters' measurement accuracy with respect to the fixed parameters to locate optimal values of the fixed parameters in an iterative way.

These previous techniques have low efficiency. For a grid-based search method, optimal values of fixed parameters to adjust are found after computing critical parameters' measurement accuracy on all sampled configurations of the fixed parameters, leading to a low efficiency issue. For a gradient-based search method, optimal values of fixed parameters to adjust are located in an iterative way. For each iteration, a gradient with respect to the fixed parameters needs to be computed numerically using the finite difference method. This can be very time consuming.

Previous techniques also have poor reliability. In situations with a large number of fixed parameters to adjust simultaneously, the only feasible choice subject to efficiency consideration is a gradient-based search method. But its performance strongly depends on starting values chosen for the fixed parameters due to the local minima issue, leading to poor reliability issues. Although this issue could be mitigated through employing multiple trials of randomly chosen starting points, this can lead to efficiency deterioration.

Therefore, improved metrology techniques and systems are needed.

BRIEF SUMMARY OF THE DISCLOSURE

In a first embodiment, a method is provided. Using a processor, a value of a fixed parameter is predicted with a neural network based on a value of a critical parameter of a semiconductor wafer. The neural network is trained based on one or more of the critical parameters and a low-dimensional real-valued vector associated with a spectrum. The spectrum may be a spectroscopic ellipsometry spectrum or a specular reflectance spectrum. The low-dimensional real-valued vector can be mapped by another neural network based on the spectrum.

The method can further include averaging the fixed parameters over samples used to generate the spectrum.

The method can further include gradient-based searching of the fixed parameters with the neural network. The gradient-based searching can include i) setting nominal values of the fixed parameters; ii) determining the critical parameters of the fixed parameters at the nominal values; iii) determining the fixed parameters of the critical parameters using the neural network; iv) determining the fixed parameters of the critical parameters from the gradient-based search with one iteration; v) updating the fixed parameters with the fixed parameters using the gradient-based search with one iteration; and vi) repeating the steps i) through v) until a stopping criteria is achieved. The stopping criteria is one of a specification or a convergence.

The method can further include training, using the processor, an initial neural network by mapping one or more of the spectrum to one or more of the low-dimensional real-valued vectors. Using the processor, the neural network can be trained to predict the fixed parameter based on one or more of the critical parameters and the low-dimensional real-valued vector from the initial neural network.

The spectrum can be generated by simulating profiles sampled within a range of the floating parameters.

Profiles of an optical critical dimension model associated with the spectrum can be generated.

Generating the profiles of the optical critical dimension can include determining a set of the fixed parameter by sampling the fixed parameters to within a range of the fixed parameters and, for each pair of spectra and fixed parameters, determining a corresponding critical parameter. A corresponding floating parameter or a corresponding constrained parameter can be determined with the corresponding critical parameter.

Training data for the initial neural network can include a plurality of samples. Each of the samples can include one or more of the spectrum and profiles of an optical critical dimension model associated with one or more of the spectrum.

Training the initial neural network can determine a parameter that minimizes a difference in the low-dimensional real-valued vector for a same one of one or more of the spectrum.

The neural network may minimize a mean squared error of the fixed parameters relative to training data.

The initial neural network and the neural network may have different architectures.

In a second embodiment, a system is provided. The system comprises a primary neural network in electronic communication with a wafer metrology tool. The primary neural network is configured to predict a value of a fixed parameter based on a value of a critical parameter of a semiconductor wafer and a low-dimensional real-valued vector derived from a spectrum of the semiconductor wafer. The spectrum may be a spectroscopic ellipsometry spectrum or a specular reflectance spectrum.

In an instance, the system includes a secondary neural network in electronic communication with the primary neural network. The secondary neural network is configured to receive the spectrum of the semiconductor wafer and to derive the low-dimensional real-valued vector based on the received spectrum. The primary neural network receives the low-dimensional real-valued vector from the secondary neural network.

The primary neural network may include a processor.

The primary neural network and the secondary neural network may have different architectures.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein use machine learning techniques to predict near-optimal values of fixed parameters when given reference values of critical parameters to boost performance of an automatic optimization process with respect to both its efficiency and reliability. For example, a neural network can be used such that the neural network uses training data that can predict values of fixed parameters to adjust given reference values of critical parameters. The fixed parameters can represent dimensions of measured structure characteristics with variability over the measurements. The variability may be classified as trivial. By adjusting the nominals of the fixed parameters that are correlated to critical parameters, the critical parameters' measurement accuracy can be optimized.

The learned neural network can map spectra into profile parameter domains of OCD models with reduced dimensions to improve its feasibility. A hybrid strategy that combines a learned neural network with a gradient-based search can be performed to provide balance between efficiency and reliability of the search process. An envelope of spectra in training data can be used to determine validity range of learned neural network for predicting fixed parameters given critical parameters. Using this information in the search process can improve reliability.

Figure 1:
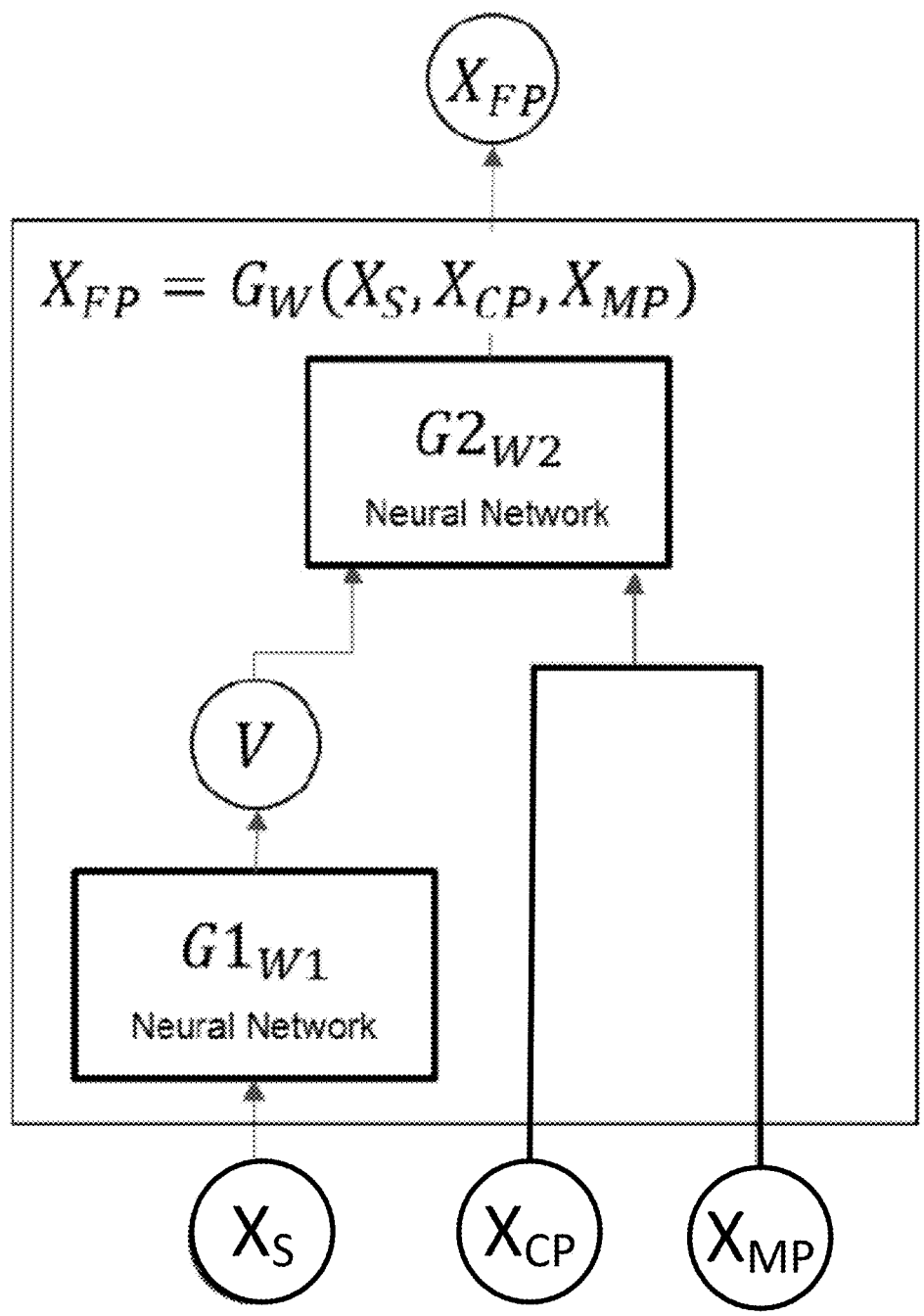
FIG. 1 is a block diagram of a neural network architecture embodiment in accordance with the present disclosure.

FIG. 1 shows an embodiment of a neural network architecture ($G_W$). A neural network is learned $G_W$: CP→FP from training data that predicts values of fixed parameters given values of critical parameters. The learned $G_W$ is then incorporated into the gradient-based search to guide the search process. As compared to the solely gradient-based search, the improved algorithm can boost the performance of the search process with respect to both its efficiency and reliability by exploiting the ability of the learned $G_W$ to efficiently find near-optimal values of fixed parameters given reference values of critical parameters without the need of numerically computing the gradient repeatedly.

Learning the neural network $G_W$ from training data is based on a two-step protocol to improve reliability of $G_W$ and also feasibility of the learning process. First a neural network $G1_{W1}$ is learned such that it maps individual spectra ($X_S$) to a low-dimensional real-valued vector V. Next, a neural network $G2_{W2}$ is learned that predicts values of fixed parameters ($X_{FP}$) given values of critical parameters ($X_{CP}$) and the low-dimensional real-valued vector V associated with spectra. The neural network $G2_{W2}$ also may be provided with other parameters ($X_{MP}$).

Automatic optimization of critical parameters' measurement accuracy can be based on grid-based search and gradient-based search methods. While the grid-based search may suffer from poor efficiency due to large search space, the gradient-based search may be prone to low reliability due to the existence of multiple local minima and also poor efficiency in complex cases due to the repeated need for numerically computing a gradient. However, either the grid-based search or gradient-based search may be used. Any limitations can be considered when selecting a search.

The neural network architecture of FIG. 1 addresses several disadvantages of the previous techniques. By employing a learned neural network, near-optimal values of fixed parameters to adjust can be found efficiently for given reference values of critical parameters within controlled accuracy and without the repeated need for numerically calculating a gradient. This can provide improved search efficiency. Furthermore, by incorporating a learned neural network into the gradient-based search, error in predicted values of fixed parameters from the learned neural network due to training error can be corrected reliably. This can ensure reliability of the overall search process. By devising criteria for testing validity of a learned neural network and using this information to devise a strategy on how to use predictions from the learned neural network in the gradient-based search, reliability of the overall search process can be further ensured.

Training data may be used during learning of $G_W$: CP→FP. Training data may include a set of samples I= $\{X_1, \ldots, X_N\}$. Each sample $X_i$ can have two components as $X_i=(X_S,X_P)$ where $X_S$ are spectra and $X_P$ are generated profiles of OCD models associated with $X_S$. $X_P$ may be a vector of the profile parameters as $X_P=(X_{CP},X_{FP},X_{MP})$, where $X_{CP}$ are critical parameters, $X_{FP}$ are fixed parameters to adjust and $X_{MP}$ are other relevant parameters (such as floating parameters or constrained parameters).

Training data may be generated. First, synthetic spectra can be generated. Given a OCD model and its floating parameters, a set of synthetic spectra can be generated $\{X_{S,1}, \ldots, X_{S,M}\}$ by simulating the profiles sampled within the given range of the floating parameters.

Figure 2:
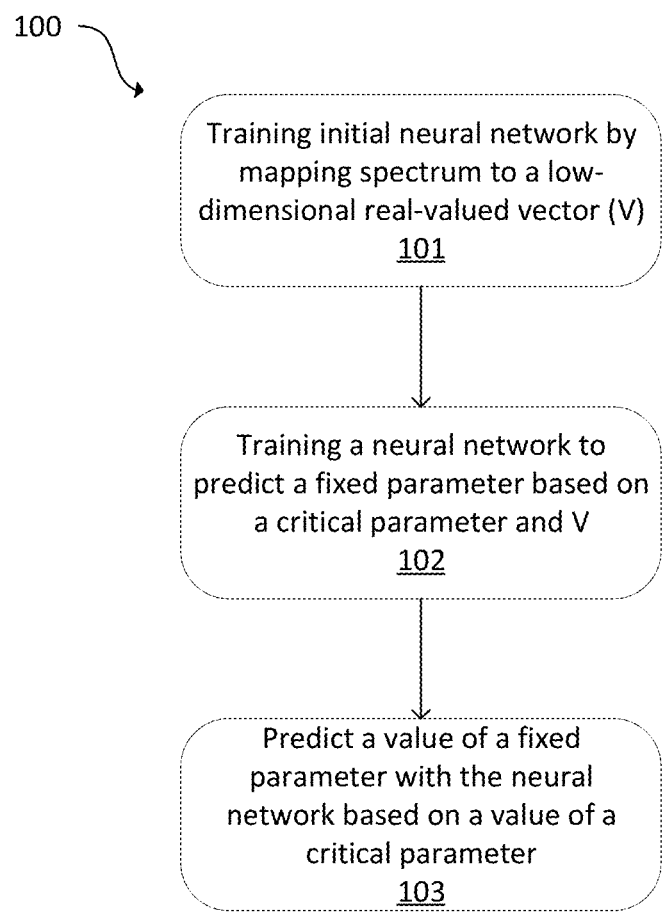
FIG. 2 is a flowchart of an embodiment of a method in accordance with the present disclosure.

FIG. 2 is a flowchart of an embodiment of a method 100. An initial neural network can be trained at 101 by mapping one or more (i.e., at least one) spectrum to one or more low-dimensional real-valued vectors. The spectrum may be a spectroscopic ellipsometry spectrum or a specular reflectance spectrum.

At 102, another neural network can be trained predict the fixed parameter based on one or more of the critical parameters and the low-dimensional real-valued vector from the initial neural network.

At 103, a value of a fixed parameter can be predicted with the neural network (e.g., the neural network trained based on one or more of the critical parameters and a low-dimensional real-valued vector associated with a spectrum) based on a value of a critical parameter of a semiconductor wafer. Thus, the low-dimensional real-valued vector is mapped by another neural network based on the spectrum than the neural network that predicts the fixed parameter. The two neural networks can have different architectures.

The fixed parameters may be averaged over samples used to generate the spectrum.

Step 103 may be performed separately from steps 102 and 101. For example, the neural network operating the prediction may be previously trained.

For example, the spectrum can be generated by simulating profiles sampled within a range of the floating parameters. Profiles of an optical critical dimension model associated with the spectrum can be generated. Generating the profiles of the optical critical dimension can include determining a set of the fixed parameter by sampling the fixed parameters to within a range of the fixed parameters. For each pair of spectra and fixed parameters, a corresponding critical parameter can be determined. A corresponding floating parameter or a corresponding constrained parameter can be determined with the corresponding critical parameter.

Training data for the initial neural network can include multiple samples. Each of the samples can include one or more of the spectrum and profiles of an optical critical dimension model associated with one or more of the spectrum. The neural network may minimize a mean squared error of the fixed parameters relative to any training data.

Training the initial neural network can include determining a parameter that minimizes a difference in the low-dimensional real-valued vector for a same one of the spectrum or spectra.

Then profiles of OCD models can be generated. A set of $\{X_{FP,1}, \ldots, X_{FP,L}\}$ can be generated by sampling the fixed parameters to adjust within their given range. For each pair of $(X_S, X_{FP})$, corresponding $(X_{CP}, X_{MP})$ can be computed using an optical metrology engine implemented in the AcuShape software product from KLA-Tencor Corporation. All the pairs can be combined to form the training data set $\{X_1, \ldots, X_N\}$ with $X_i = (X_S, (X_{CP}, X_{FP}, X_{MP}))$.

A learning protocol can then be performed. Neural network $G1_{W1}: X_S \rightarrow V$ is learned in a manner that maps each spectra to a low-dimensional real-valued vector V.

$G1_{W1}$ is a function constructed in terms of neural network, parameterized by W1. The input to $G1_{W1}$ can be the profile parameters vector $(X_{CP}, X_{FP}, X_{MP})$ computed from $X_S$ using, for example, the AcuShape engine. An objective is to find the parameters W1 such that the difference in V between profiles associated with same spectra is minimized whereas the difference in V between profiles associated with different spectra is maximized. This process can be implemented by minimizing a contrastive loss function fed by output of two identical $G1_{W1}$ with pairs of profiles as its input, which makes $G1_{W1}$ map profiles associated with same spectra to nearby points of V and those associated with different spectra to distant points of V.

Neural network $G2_{W2}: (V, X_{CP}, X_{MP}) \rightarrow X_{FP}$ is learned to predict $X_{FP}$ given $X_{CP}$ and V associated with $X_S$. $G2_{W2}$ also can be a function constructed in terms of neural network, parameterized by W2, but with a different architecture from $G1_{W1}$. The input to $G2_{W2}$ may be $(V, X_{CP}, X_{MP})$. An objective can be to minimize the mean squared error of $X_{FP}|G2_{W2}(V, X_{CP}, X_{MP}) - X_{FP}|^2$ on the training data.

Therefore, the learned $G_W$ can be a composite function as $G_W(X_S, X_{CP}, X_{MP}) = G2_{W2}(G1_{W1}(X_S), X_{CP}, X_{MP})$.

Compared to directly training $G_W: (X_S, X_{CP}, X_{MP}) \rightarrow X_{FP}$, the added $G1_{W1}$ presents at least two advantages. First, it reduces dimensions of spectra and can eliminate redundancies in the information carried by the spectra. Second, it maps spectra into the same domain as the profile parameters, such as with a training method.

The existence of $G1_{W1}$ may be based on the physical understanding of relationships between profiles of OCD models and spectra. The former has a many-to-one relationship to the latter due to correlation between the profile parameters. $G1_{W1}$ can reduce the correlation by deriving V associated with individual spectra, which can lead to a one-to-one relationship between spectra and V.

The validity range of the learned $G_W$ can be computed in terms of an envelope of the spectra set in the training data. Since reliability of $G_W$ may be ensured only within the range of the training data and the range of profile parameters intrinsically determined by that of the associated spectra, the computed envelope can be used in the prediction process to evaluate whether a test sample is within the validity range of the learned $G_W$.

In an instance, the envelope of spectra in the training data can be computed by finding maximum and minimum of spectra at each wavelength point.

Fixed parameters can be predicted given critical parameters with the learned $G_W$. For a set of test samples $T = \{X_1, \ldots, X_M\}$ with each corresponding to individual spectra, $G_W$ can be evaluated over them to produce a set of $X_{FP}$. The fixed parameter values are estimated by averaging $X_{FP}$ over the samples. Note that the effects of the training error in $G_W$ can be considerably mitigated because averaged values of predicted values of FPs from $G_W$ are used.

In an instance, validity of the predictions for an individual test sample can be evaluated by testing whether the test spectra is within the computed spectra envelope over all wavelength points. A spectra envelope can be given by a minimum and maximum values of a training spectra at each wavelength point. For a given test spectra, the evaluation process may test whether at each wavelength point the test spectra is within the pre-computed range (e.g., the minimum and maximum).

When searching with the learned $G_W$, a hybrid strategy may be constructed by incorporating the learned $G_W$ into the gradient-based search. This can ensure both efficiency and reliability of the search. For given reference values of critical parameters, while $G_W$ can be used to efficiently predict sub-optimal values of fixed parameters, the gradient search starts from the predicted near-optimal values of a fixed parameter and can adjust fixed parameters to find their actual optimal values by reliably correcting the training error in $G_W$. A validity test of the learned $G_W$ on individual test samples may be performed, which can be used to determine how to deal with predictions from $G_W$ at the step of the gradient-based search.

For given reference values of critical parameters, optimal values of fixed parameters are searched for using the hybrid strategy. The hybrid strategy may be performed iteratively.

Gradient-based searching of the fixed parameters may be performed with the neural network. This can include i) setting nominal values of the fixed parameters; ii) determining the critical parameters of the fixed parameters at the nominal values; iii) determining the fixed parameters of the critical parameters using the neural network; iv) determining the fixed parameters of the critical parameters from the gradient-based search with one iteration; v) updating the fixed parameters with the fixed parameters using the gradient-based search with one iteration; and vi) optionally repeating the steps i) through v) until a stopping criteria is achieved. The stopping criteria may be a specification or a convergence.

Figure 3:
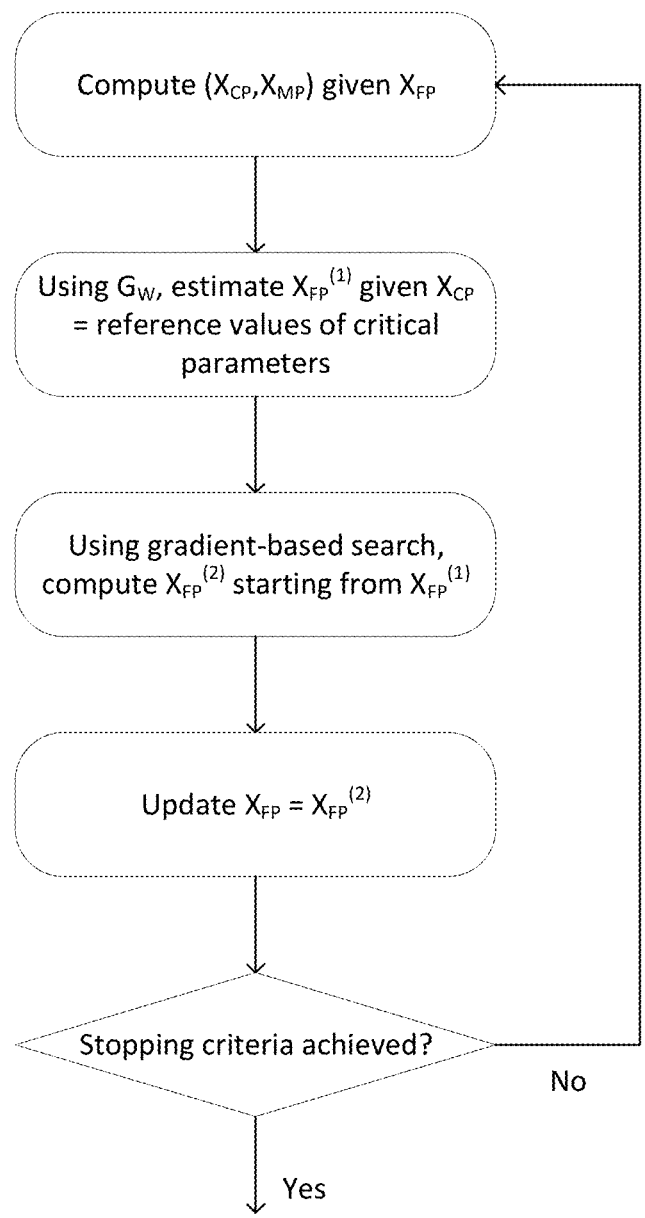
FIG. 3 is a flowchart illustrating a subset of a method in accordance with the present disclosure.

In an example, the nominal values of fixed parameters are set at $X_{FP}$ and $(X_{CP}, X_{MP})$ are computed using the AcuShape Engine. Assuming $X_{CP}$ is equal to the reference values of critical parameters, $X_{FP}^{(1)}$ is determined using $G_W$. Validity of $G_W$ on the individual test samples may also be tested. Starting from $X_{FP}^{(1)}$, $X_{FP}^{(2)}$ may be found using the gradient-based search with only one iteration. With the aid of validity of $G_W$ on the test samples that was determined, a more sophisticated strategy on how to use $X_{FP}^{(1)}$ can be devised. $X_{FP}$ is then updated with $X_{FP}^{(2)}$. These steps may optionally be repeated until a specified stopping criteria is achieved. As an example of the stopping criteria, the accuracy specification of critical parameters may be achieved. Thus, if the stopping criteria is not achieved then nominal values of fixed parameters are set at $X_{FP}$ and $(X_{CP}, X_{MP})$ are computed again using the AcuShape Engine. This technique is illustrated in FIG. 3.

In an embodiment, real measured spectra data can be used instead of synthetic spectra. A mixture of real measured spectra data and synthetic spectra also can be used.

In an embodiment, transformation to the reference values of critical parameters, such as offsetting and de-trending, can be applied to deal with overall shift in measurement of reference data when predicting values of fixed parameters given reference values of critical parameters.

In an embodiment, a more flexible combination between the step using the learned neural network and the gradient-based search can be performed when searching with the learned neural network. This can further balance efficiency and reliability of the search process.

Figure 4:
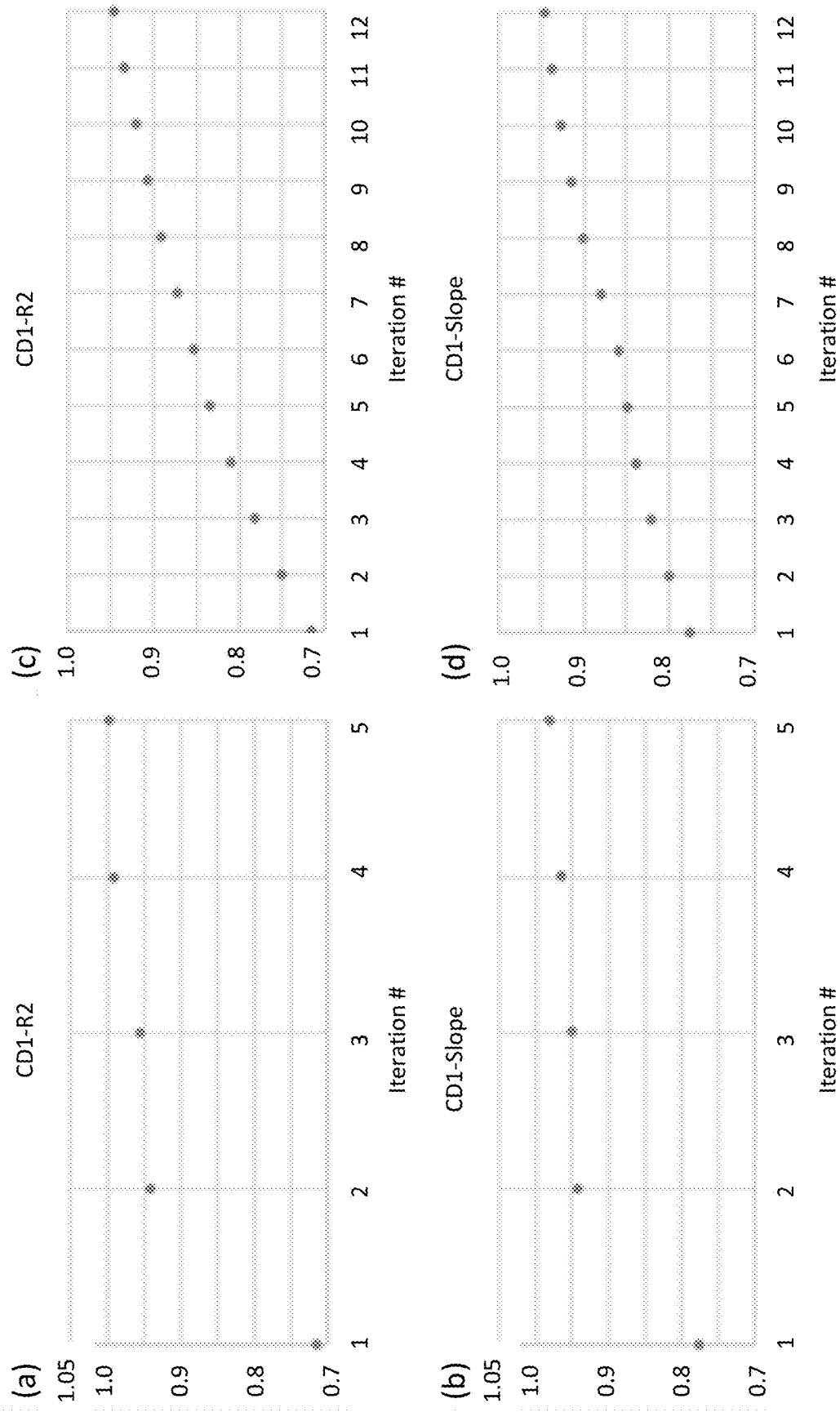
FIG. 4 is illustrates results of a critical dimension (CD1) accuracy with a learned neural network $G_W$ in (a) and (b) and without the learned neural network $G_W$ in (c) and (d)

FIG. 4 is illustrates results of a critical dimension (CD1) accuracy with a learned neural network $G_W$ in (a) and (b) and without the learned neural network $G_W$ in (c) and (d). The example in FIG. 4, which is meant to illustrative and not limiting, is based on synthetic spectra data.

An embodiment of the techniques disclosed herein was implemented and tested on a proxy model mimicking Fin-FET structures in both logic and dynamic random-access memory (DRAM) layers. A goal was to optimize measurement accuracy for CD1 by adjusting nominal values of $\theta_1$, which measures fin sidewall bowing.

For training data, synthetic spectra and profiles of the model were generated using the AcuShape engine in two steps. First, a set of thirty synthetic spectra were generated within given range of floating parameters of the model. Then, for each spectrum sample, one hundred profiles were generated by sampling $\theta_1$ within its given range.

In FIG. 4, (a) and (b) illustrate the results of optimization of CD1's accuracy with the learned neural network $G_W$. In FIG. 4, (c) and (d) illustrate the results of optimization of CD1's accuracy without the learned neural network $G_W$. With $G_W$, only one iteration was used to locate near optimal values of $\theta_1$ where CD1 had an accuracy (R2) of approximately 0.95 and a slope of approximately 0.95. This verified the ability of the learned neural network $G_W$ to predict sub-optimal values of fixed parameters given reference values of critical parameters. The efficiency improvement can be further quantitatively evaluated by noting that one iteration for the neural network takes approximately 0.09 seconds while one iteration for the gradient-based search takes approximately 37.55 seconds.

Further tests of the embodiments disclosed herein included use of the proxy model with spectra sample of a larger size and use of the proxy model on a realistic DRAM case. Performance boosting was confirmed in these tests.

Figure 5:
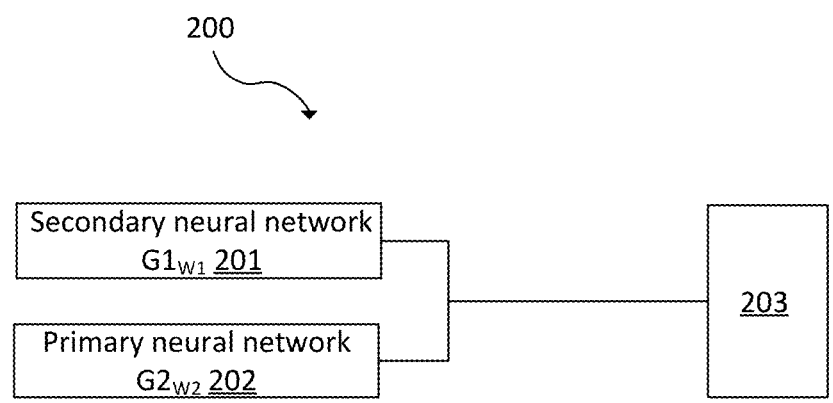
FIG. 5 is block diagram of an embodiment of a system in accordance with the present disclosure.

FIG. 5 is a block diagram of a system 200. The system includes a primary neural network $G2_{W2}$ 202 and a secondary neural network $G1_{W1}$ 201 (also referred to as an initial neural network). Each of these neural networks can be implemented on a processor or multiple processors. The neural networks also can be implemented on the same processor. The processor or processors are in electronic communication with a wafer metrology tool 203. The wafer metrology tool 203 can generate information used by the processor or processors.

The primary neural network $G2_{W2}$ 202, which may include a processor, may be in electronic communication with the wafer metrology tool 203. The primary neural network $G2_{W2}$ 202 can be configured to predict a value of a fixed parameter based on a value of a critical parameter of a semiconductor wafer and a low-dimensional real-valued vector derived from a spectrum of the semiconductor wafer. The spectrum may be a spectroscopic ellipsometry spectrum or a specular reflectance spectrum.

The secondary neural network $G1_{W1}$ 201 may be in electronic communication with the primary neural network $G2_{W2}$ 202. The secondary neural network $G1_{W1}$ 201 can be configured to receive the spectrum of the semiconductor wafer and to derive the low-dimensional real-valued vector based on the received spectrum. The primary neural network $G2_{W2}$ 202 can receive the low-dimensional real-valued vector from the secondary neural network $G1_{W1}$ 201.

The primary neural network $G2_{W2}$ 202 and the secondary neural network $G1_{W1}$ 201 can have different architectures.

The system 200 also can include one or more electronic data storage units in electronic communication with the processor or processors for the primary neural network $G2_{W2}$ 202 and/or the secondary neural network $G1_{W1}$ 201. The electronic data storage unit may be in electronic communication with the wafer metrology tool 203.

The processor or processors for the primary neural network $G2_{W2}$ 202 and the secondary neural network $G1_{W1}$ 201 and the electronic data storage unit or units may be part of the wafer metrology tool 203 or another device. In an example, the processor and electronic data storage unit may be part of a standalone control unit or in a centralized quality control unit. Multiple processors or electronic data storage units may be used. Thus, the primary neural network $G2_{W2}$ 202 and the secondary neural network $G1_{W1}$ 201 may be part of the wafer metrology tool 203.

Each processor may be implemented in practice by any combination of hardware, software, and firmware. For example, the processor may include a microprocessor, a microcontroller, or other devices. Also, its functions as described herein may be performed by one unit, or divided up among different components, each of which may be implemented in turn by any combination of hardware, software, and firmware. Program code or instructions for the processor to implement various methods and functions may be stored in readable storage media, such as a memory in the electronic data storage unit or other memory.

The processor may be coupled to the components of the system 200 in any suitable manner (e.g., via one or more transmission media, which may include wired and/or wireless transmission media) such that the processor can receive output. The processor may be configured to perform a number of functions using the output.

The processor, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a processor for performing a computer-implemented metrology, as disclosed herein. In particular, the processor can be coupled to a memory in the electronic data storage unit or other electronic data storage medium with non-transitory computer-readable medium that includes program instructions executable on the processor. The computer-implemented method may include any step(s) of any method(s) described herein. For example, the processor may be programmed to perform some or all of the steps of FIG. 2, FIG. 3, or other embodiments disclosed herein. The memory in the electronic data storage unit or other electronic data storage medium may be a storage medium such as a magnetic or optical disk, a magnetic tape, or any other suitable non-transitory computer-readable medium known in the art. In particular, the electronic data storage unit 202 can include persistent storage, random access memory, or a split database.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

The present disclosure may be embodied to use neural networks. In some embodiments, a neural network is a generative model. A generative model can be generally defined as a model that is probabilistic in nature. In other words, a generative model is not one that performs forward simulation or rule-based approaches. Instead, the generative model can be learned (in that its parameters can be learned) based on a suitable training set of data.

In an embodiment, a neural network is configured as a deep generative model. For example, the model may be configured to have a deep learning architecture in that the model may include multiple layers, which perform a number of algorithms or transformations. The number of layers on one or both sides of the model may vary. For example, the number of layers on the encoder side of the generative model is use case dependent. In addition, the number of layers on the decoder side is use case dependent and may be dependent on the number of layers on the encoder side. In general, the number of layers on one or both sides of the generative model is not significant and is use case dependent. For practical purposes, a suitable range of layers on both sides is from two layers to a few tens of layers.

In another embodiment, a neural network may be a deep learning neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and can excel in areas where the solution or feature detection is difficult to express in a traditional computer program. Deep learning is a probabilistic graph model with multiple neuron layers, commonly known as a deep architecture. Deep learning technology processes the information such as image, text, voice, or other inputs in a hierarchical manner. In using deep learning in the present disclosure, feature extraction is accomplished automatically using learning from data. This is advantageous over previous approaches which extract features based on experts' understanding of a set of images. In this disclosure, predict near-optimal values of fixed parameters are predicted by the neural network given reference values of critical parameters.

Neural networks typically consist of multiple layers, and the signal path traverses from front to back. The goal of the neural network is to solve problems in the same way that the human brain would. Neural network projects typically work with a few thousand to a few million neural units and millions of connections. The neural network may have any suitable architecture and/or configuration known in the art.

There are many variants of neural networks with deep architecture depending on the probability specification and network architecture, including, but not limited to, a Deep Belief Network (DBN), a Restricted Boltzmann Machine (RBM), an Auto-Encoders, or a convolutional neural network (CNN). The actual implementation may vary depending on the information available, size of the information provided, and the nature of the problem.

The wafer metrology tool 203 in FIG. 5 may include an illumination system which illuminates a target; a collection system which captures relevant information provided by the illumination system's interaction (or lack thereof) with a target, device, or feature; and a processing system which analyzes the information collected using one or more algorithms.

The wafer metrology tool 203 can include one or more hardware configurations which may be used to measure the various semiconductor structural and material characteristics. Examples of such hardware configurations include, but are not limited to, a spectroscopic ellipsometer (SE); an SE with multiple angles of illumination; an SE measuring Mueller matrix elements (e.g., using rotating compensator(s)); a single-wavelength ellipsometers; a beam profile ellipsometer (angle-resolved ellipsometer); a beam profile reflectometer (angle-resolved reflectometer); a broadband reflective spectrometer (spectroscopic reflectometer); a single-wavelength reflectometer; an angle-resolved reflectometer; an imaging system; or a scatterometer (e.g., speckle analyzer). The hardware configurations can be separated into discrete operational systems or can be combined into a single tool.

The illumination system of certain hardware configurations can include one or more light sources. The light source may generate light having only one wavelength (i.e., monochromatic light), light having a number of discrete wavelengths (i.e., polychromatic light), light having multiple wavelengths (i.e., broadband light), and/or light the sweeps through wavelengths, either continuously or hopping between wavelengths (i.e., tunable sources or swept source). Examples of suitable light sources are: a white light source, an ultraviolet (UV) laser, an arc lamp or an electrodeless lamp, a laser sustained plasma (LSP) source, a supercontinuum source such as a broadband laser source, shorter-wavelength sources such as x-ray sources, extreme UV sources, or some combination thereof. The light source may also be configured to provide light having sufficient brightness, which in some cases may be a brightness greater than about 1 W/(nm cm$^2$ Sr). The wafer metrology tool 203 may also include a fast feedback to the light source for stabilizing its power and wavelength. Output of the light source can be delivered via free-space propagation, or in some cases delivered via optical fiber or light guide of any type.

The wafer metrology tool 203 may be designed to make many different types of measurements related to semiconductor manufacturing. For example, in certain embodiments the wafer metrology tool 203 may measure characteristics of one or more targets, such as critical dimensions, overlay, sidewall angles, film thicknesses, or process-related parameters (e.g., focus and/or dose). The targets can include certain regions of interest that are periodic in nature, such as gratings in a memory die. Targets can include multiple layers (or films) whose thicknesses can be measured by the wafer metrology tool 203. Targets can include target designs placed (or already existing) on the semiconductor wafer for use, such as with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools. The data from such measurements may be combined. Data from the metrology tool is used in the semiconductor manufacturing process, for example, to feedforward, feed-backward and/or feed-sideways corrections to the process (e.g., lithography, etch) and, therefore, can yield a complete process control solution.

Collected data can be analyzed by a number of data fitting and optimization techniques and technologies including: libraries; fast-reduced-order models; regression; machine-learning algorithms such as neural networks and support-vector machines (SVM); dimensionality-reduction algorithms such as principal component analysis (PCA), independent component analysis (ICA), and local-linear embedding (LLE); sparse representation such as Fourier or wavelet transform; Kalman filter; algorithms to promote matching from same or different tool types, and others. Collected data can also be analyzed by algorithms that do not include modeling, optimization and/or fitting.

Computational algorithms are usually optimized for metrology applications with one or more approaches being used such as design and implementation of computational hardware, parallelization, distribution of computation, load-balancing, multi-service support, or dynamic load optimization. Different implementations of algorithms can be done in firmware, software, field programmable gate array (FPGA), and programmable optics components, etc.

The data analysis and fitting steps usually pursue one or more goals. For example, the goal may be measurement of CD, sidewall angle (SWA), shape, stress, composition, films, bandgap, electrical properties, focus/dose, overlay, generating process parameters (e.g., resist state, partial pressure, temperature, and focusing model), and/or any combination thereof. The goal may be modeling and/or design of metrology systems. The goal also may be modeling, design, and/or optimization of metrology targets.

Embodiments of the present disclosure address the field of semiconductor metrology and are not limited to the hardware, algorithm/software implementations and architectures, and use cases summarized above.

As used herein, the term "wafer" generally refers to substrates formed of a semiconductor or non-semiconductor material. Examples of such a semiconductor or non-semiconductor material include, but are not limited to, monocrystalline silicon, gallium nitride, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photoresist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. Many different types of devices may be formed on a wafer, and the term wafer as used herein is intended to encompass a wafer on which any type of device known in the art is being fabricated.

Other types of wafers also may be used. For example, the wafer may be used to manufacture LEDs, solar cells, magnetic discs, flat panels, or polished plates. Measurements of other objects, such as reticles, also may be classified using techniques and systems disclosed herein.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
    predicting, using a processor, a value of a fixed parameter with a neural network based on a value of a critical parameter of a semiconductor wafer, wherein the neural network is trained based on one or more of the critical parameters and a low-dimensional real-valued vector associated with a spectrum, and wherein the fixed parameter represents dimensions of a measured structure; and
    evaluating, using the processor, the value of the fixed parameter by determining if a test spectra is within a spectra envelope over wavelength points, wherein the spectra envelope is between a minimum and a maximum value for training spectra at each of the wavelength points.

2. The method of claim 1, wherein the spectrum is a spectroscopic ellipsometry spectrum or a specular reflectance spectrum.

3. The method of claim 1, wherein the low-dimensional real-valued vector is mapped by another neural network based on the spectrum.

4. The method of claim 1, further comprising:
    training, using the processor, an initial neural network by mapping one or more of the spectrum to one or more of the low-dimensional real-valued vectors; and
    training, using the processor, the neural network to predict the fixed parameter based on one or more of the critical parameters and the low-dimensional real-valued vector from the initial neural network.

5. The method of claim 4, further comprising generating the spectrum by simulating profiles sampled within a range of floating parameters.

6. The method of claim 5, further comprising generating profiles of an optical critical dimension model associated with the spectrum.

7. The method of claim 6, wherein generating the profiles of the optical critical dimension includes:
    determining a set of the fixed parameters by sampling the fixed parameters to within a range of the fixed parameters; and
    for each pair of spectra and fixed parameters, determining a corresponding critical parameter.

8. The method of claim 7, further comprising determining a corresponding floating parameter or a corresponding constrained parameter with the corresponding critical parameter.

9. The method of claim 4, wherein training data for the initial neural network includes a plurality of samples, wherein each of the samples includes one or more of the spectrum and profiles of an optical critical dimension model associated with one or more of the spectrum.

10. The method of claim 4, wherein training the initial neural network determines a parameter that minimizes a difference in the low-dimensional real-valued vector for a same one of one or more of the spectrum.

11. The method of claim 4, wherein the neural network minimizes a mean squared error of a set of the fixed parameters relative to training data.

12. The method of claim 4, wherein the initial neural network and the neural network have different architectures.

13. The method of claim 1, further comprising averaging a set of the fixed parameters over samples used to generate the spectrum.

14. The method of claim 1, further comprising gradient-based searching of a set of the fixed parameters with the neural network.

15. The method of claim 14, wherein the gradient-based searching includes:
   i) setting nominal values of the fixed parameters;
   ii) determining the critical parameters of the fixed parameters at the nominal values;
   iii) determining the fixed parameters of the critical parameters using the neural network;
   iv) determining the fixed parameters of the critical parameters from the gradient-based search with one iteration;
   v) updating the fixed parameters with the fixed parameters using the gradient-based search with one iteration; and
   vi) repeating the steps i) through v) until a stopping criteria is achieved, wherein the stopping criteria is one of a specification or a convergence.

16. A system comprising:
   a primary neural network in electronic communication with a wafer metrology tool, wherein the primary neural network is configured to predict a value of a fixed parameter based on a value of a critical parameter of a semiconductor wafer and a low-dimensional real-valued vector derived from a spectrum of the semiconductor wafer, and wherein the fixed parameter represents dimensions of a measured structure; and
   a processor configured to evaluate the value of the fixed parameter by determining if a test spectra is within a spectra envelope over wavelength points, wherein the spectra envelope is between a minimum and a maximum value for training spectra at each of the wavelength points.

17. The system of claim 16, wherein the spectrum is a spectroscopic ellipsometry spectrum or a specular reflectance spectrum.

18. The system of claim 16, further comprising a secondary neural network in electronic communication with the primary neural network, wherein the secondary neural network is configured to receive the spectrum of the semiconductor wafer and to derive the low-dimensional real-valued vector based on the received spectrum, and wherein the primary neural network receives the low-dimensional real-valued vector from the secondary neural network.

19. The system of claim 18, wherein the primary neural network includes a processor.

20. The system of claim 18, wherein the primary neural network and the secondary neural network have different architectures.

* * * * *